US012566213B2

(12) United States Patent (10) Patent No.: US 12,566,213 B2
Kim et al. (45) Date of Patent: Mar. 3, 2026

(54) TEST DEVICE AND TEST METHOD IMPLEMENTING THE SAME

(71) Applicant: SAMSUNG ELECTRONICS CO., LTD., Suwon-si (KR)

(72) Inventors: Gyuyeol Kim, Suwon-si (KR); Jaewoong Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 18/592,221

(22) Filed: Feb. 29, 2024

(65) Prior Publication Data

US 2024/0310439 A1 Sep. 19, 2024

(30) Foreign Application Priority Data

Mar. 14, 2023 (KR) ........................ 10-2023-0033466

(51) Int. Cl.
| | |
|---|---|
| *G01R 31/319* | (2006.01) |
| *G01R 1/04* | (2006.01) |
| *G01R 1/067* | (2006.01) |
| *G01R 1/073* | (2006.01) |
| *G01R 31/02* | (2006.01) |
| *G01R 31/30* | (2006.01) |
| *G01R 35/00* | (2006.01) |

(52) U.S. Cl.
CPC ... *G01R 31/31905* (2013.01); *G01R 1/07342* (2013.01); *G01R 31/3004* (2013.01)

(58) Field of Classification Search
CPC .......... G01R 1/04; G01R 1/067; G01R 1/073; G01R 31/02; G01R 31/26; G01R 31/28; G01R 31/30; G01R 31/319; G01R 35/00
See application file for complete search history.

(56) References Cited

U.S. PATENT DOCUMENTS

| | | | |
|---|---|---|---|
| 6,593,765 B1 | 7/2003 | Ishida et al. | |
| 7,609,080 B2 | 10/2009 | Miller et al. | |
| 7,847,571 B2 | 12/2010 | Chang | |
| 8,736,292 B2* | 5/2014 | Ishigaki | G01R 1/07385 |
| | | | 324/754.01 |
| 9,696,402 B2 | 7/2017 | Kang et al. | |
| 11,067,658 B2 | 7/2021 | Ji et al. | |
| 2007/0170939 A1* | 7/2007 | Park | G01R 31/2886 |
| | | | 324/750.01 |

FOREIGN PATENT DOCUMENTS

KR 10-0739883 B1 7/2007

* cited by examiner

*Primary Examiner* — Neel D Shah
(74) *Attorney, Agent, or Firm* — Sughrue Mion, PLLC

(57) ABSTRACT

A test device includes a tester configured to provide a plurality of electrical signals to a device under test (DUT), and a probe card removably attached to the tester, the probe card including a plurality of channels and at least one detection circuit, where each of the plurality of channels includes a path through which a respective electrical signal of the plurality of electrical signals moves from the tester to the DUT, the at least one detection circuit is connected to one of the plurality of channels, and the at least one detection circuit is configured to determine whether the connected channel is defective.

20 Claims, 12 Drawing Sheets

| MEASURED CURRENT (ION) | DETERMINATION |
|---|---|
| ION<IR | DEFECTIVE(open) |
| ION=IR | GOOD |
| ION>IR | DEFECTIVE(short) |

TEST DEVICE AND TEST METHOD IMPLEMENTING THE SAME

CROSS-REFERENCE TO RELATED APPLICATION

This application is based on and claims priority to Korean Patent Application No. 10-2023-0033466, filed on Mar. 24, 2023, in the Korean Intellectual Property Office, the disclosure of which is incorporated by reference herein in its entirety.

BACKGROUND

Example embodiments of the disclosure relate to a test device and a test method implementing the test device, and more particularly, to a test device and a test method for inspecting a semiconductor device and a semiconductor package.

After a plurality of semiconductor devices are formed on a wafer through a semiconductor device manufacturing process, an electrical characteristic test is performed on each semiconductor device. The electrical characteristic test may be performed by applying an electrical signal to semiconductor devices on the wafer and reading an output signal in response to the applied electrical signal. Such an electrical signal may be read and output by a probe card including a plurality of probes. The plurality of probes are configured to contact pads formed on semiconductor devices and inspect the semiconductor devices. As semiconductor devices are integrated, electrical signals input to test the semiconductor devices have been increasing.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a test device capable of inspecting whether a power signal is input without a separate device and a test method implementing the test device.

One or more example embodiments also provide a test device capable of inspecting an electrical connection between a power channel and a test before inspecting a semiconductor device, and a test method including the test device.

Additional aspects will be set forth in part in the description which follows and, in part, will be apparent from the description, or may be learned by practice of the presented embodiments.

According to an aspect of the disclosure, a test device may include a tester configured to provide a plurality of electrical signals to a device under test (DUT), and a probe card removably attached to the tester, the probe card including a plurality of channels and at least one detection circuit, where each of the plurality of channels includes a path through which a respective electrical signal of the plurality of electrical signals moves from the tester to the DUT, the at least one detection circuit is connected to one of the plurality of channels, and the at least one detection circuit is configured to determine whether the connected channel is defective.

According to an aspect of the disclosure, a test device may include a tester configured to provide a plurality of electrical signals to a DUT, a probe card including a substrate configured to be removably attached from the tester, and a connector portion in which the tester is configured to contact the probe card when the probe card is attached to the tester, where the probe card includes a plurality of channels and at least one detection circuit, the plurality of channels respectively receive the plurality of electrical signals, each of the plurality of channels includes a path through a respective electrical signal of the plurality of electrical signals moves from the tester to the DUT, the at least one detection circuit is connected to one of the plurality of channels and the at least one detection circuit is configured to determine whether the connector portion is defective.

According to an aspect of the disclosure, a test method of a semiconductor device may include providing a probe card on a tester, the probe card including at least one detection circuit, determining whether a power channel through which a power signal moves is defective, the power signal being among a plurality of electrical signals provided by the tester, and wherein the at least one detection circuit is connected to the power channel, based on determining that the power channel is defective inspecting, by the at least one detection circuit a connection between the probe card and the tester, and based on determining that the power channel is not defective, attaching a DUT to the probe card and inspecting, by the at least one detection circuit, the DUT.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
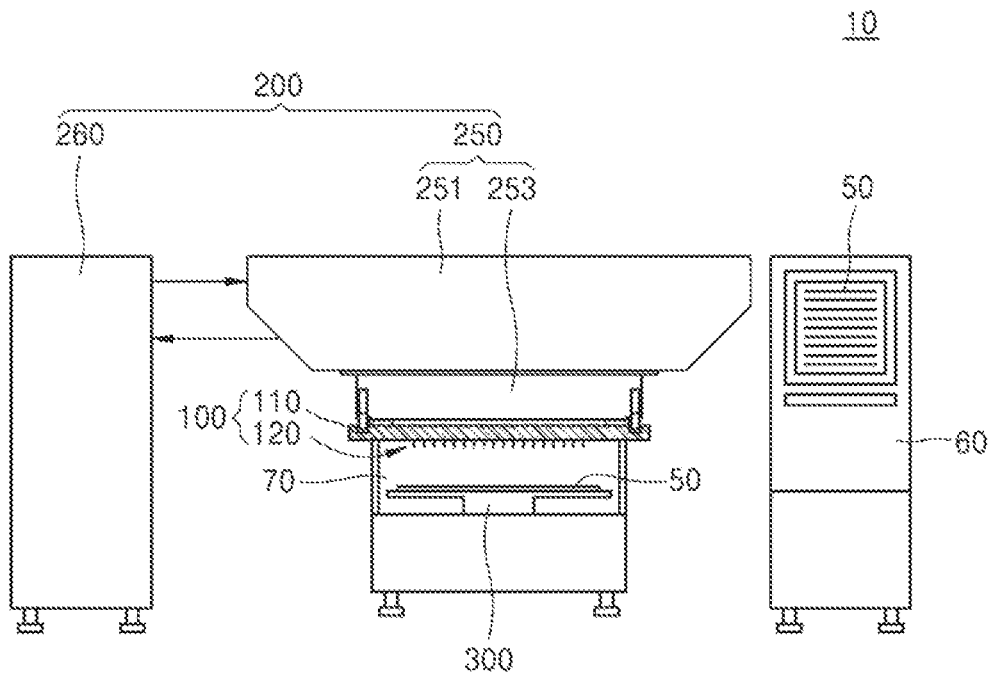
FIG. 1 is a diagram illustrating a test device according to some embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram illustrating a test device according to some embodiments.

Referring to FIG. 1, a test device 10 may include a probe card 100, a test chamber 70, and a tester 200. In some embodiments, the test device 10 may further include a loader chamber 60.

The loader chamber 60 may be a space in which wafers to be tested are stored, and wafers (e.g., wafer 50) stored in the loader chamber 60 may be moved to a stage 300 of the test chamber 70 one by one by a moving device for testing.

Figure 2:
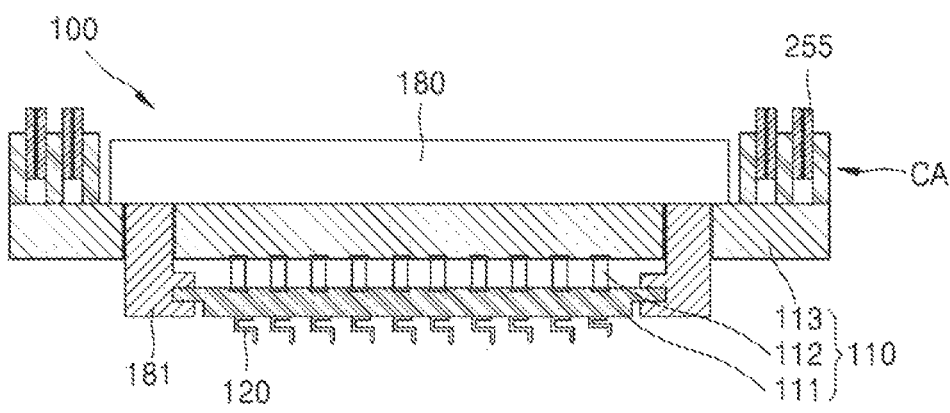
FIG. 2 is a cross-sectional view illustrating a probe card according to some embodiments.
Figure 2:
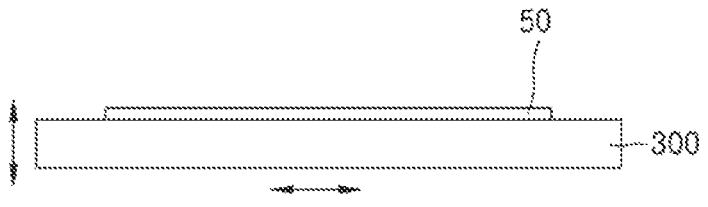

The test chamber 70 may provide a space for testing electrical characteristics of a device under test (DUT), and the stage 300 supporting the wafer 50 may be disposed in the test chamber 70. The stage 300 may support the wafer 50 and may perform a function of moving the wafer 50 up vertically and/or horizontally as shown in FIG. 2.

The probe card 100 may include a substrate 110 and the probe pins 120. Because the size of each DUT formed on the wafer 50 is very small, it may be difficult to directly connect the tester 200 generating an electrical signal to each DUT. Therefore, the probe card 100 may be used as an intermediate medium between the tester 200 generating the electrical signal and the wafer 50 on which each DUT is provided.

Specifically, when the wafer 50 to be tested in a test operation is located at an appropriate position, the stage 300 may move the wafer 50 upward such that probe pins 120 of the probe card 100 contact pads of the DUT of the wafer 50. The stage 300 may move the wafer 50 downward when a test ends.

The probe card 100 may be disposed such that one surface of the probe card 100 on which the probe pins 120 are disposed faces an open part of the upper portion of the test chamber 70, and the wafer 50 may be disposed on the stage 300 to face the probe card 100 in the test chamber 70. When the wafer 50 is placed on the stage 300, pads of the DUT may be aligned in an arrangement direction of the probe pins 120 of the probe card 100 using a flat zone or notch of the wafer 50.

As such, when the pads of the DUT are aligned below the probe pins 120 of the probe card 100 in a vertical direction, and as the stage 300 moves linearly in the vertical direction, the pads of the DUT in the wafer 50 may electrically contact the probe pins 120 of the probe card 100.

The tester 200 may provide a plurality of electrical signals to the DUT (i.e., the wafer 50). The tester 200 may include a test head 250 and a test body 260. The test body 260 may be connected to the test head 250 to transmit/receive data through wired or wireless communication.

The test head 250 may include a test head board 251 and a base 253. The test head board 251 may constitute the body of the test head 250, may have a square flat plate shape, and may have an inclination to the side such that the area of a lower surface of the test head board 251 may be smaller than the area of an upper surface thereof. However, the shape of the test head board 251 is not limited thereto. For example, the test head board 251 may have a general rectangular flat shape of which upper and lower surfaces are the same or a circular flat shape.

The base 253 may be disposed on the lower surface of the test head board 251, may have a ring shape with an empty central portion. The probe card 100 may be coupled to the lower surface of the base 253. The structure of the base 253 may have various structures depending on the shape of the probe card 100.

The test body 260 may generate a plurality of electrical signals for testing DUTs, and respectively provide the plurality of electrical signals to the DUTs within the wafer 50 through the test head 250 and the probe card 100. In addition, the test body 260 may receive an output signal output from each DUT through the probe card 100 and the test head 250 in response to the plurality of electrical signals respectively transmitted to the DUTs, such that it may be determined whether each DUT is defective and whether the probe pins 120 of the probe card 100 are defective. For example, the DUT may be determined to be defective when a non-normal state is determined, such as a short-circuit state, an open state, etc., as is described in detail below. That is, the DUT may be determined to be defective when the test device 10 determines that the DUT does not operate as intended when implemented with the probe card 100. As one example, the DUT may be determined to be defective when an output signal such as an output current output from the DUT and measured by the test device 10 is out of a predetermined range.

The probe card 100 may be removably attached (i.e., attached to or detached from) to the tester 200. That is, the probe card 100 may be removably attached to the tester 200 according to the driving of the test head 250.

In some embodiments, the tester 200 may physically contact and be electrically connected to the substrate 110 of the probe card 100. The signal transmitted by the tester 200 may pass through the substrate 110 of the probe card 100 and be transferred to the wafer 50 through the probe pins 120.

The substrate 110 may have a disk shape, and a plurality of male or female connectors may be formed on an upper surface thereof in a circumferential direction. The probe card 100 may be coupled to the test head 250 formed thereon using the male or female connectors.

The probe pins 120 may be attached to one surface of the substrate 110 to physically contact the DUTs and respectively transfer the plurality of electrical signals received from the tester 200 to the DUTs. Specifically, the probe pin 120 may contact the pad of each DUT and transfer at least one of the electrical signals received from the tester 200 (e.g., power and signal) to the pad. In some embodiments, after a test process is completed, the probe pins 120 may be removed from the probe card 100.

The substrate 110 of the probe card 100 of the disclosure may include a detection circuit configured to determine a defect occurring in a process of transferring the electrical signal received from the tester 200 to the DUT. In particular, the detection circuit may determine a defect occurring in a process of transferring a power signal, among electrical signals, that provides power to the DUT. The test device 10 of the disclosure may determine whether transfer of the power signal is defective through the detection circuit without a separate device or process, thereby quickly determining whether transfer of the power signal is defective.

Figure 3:
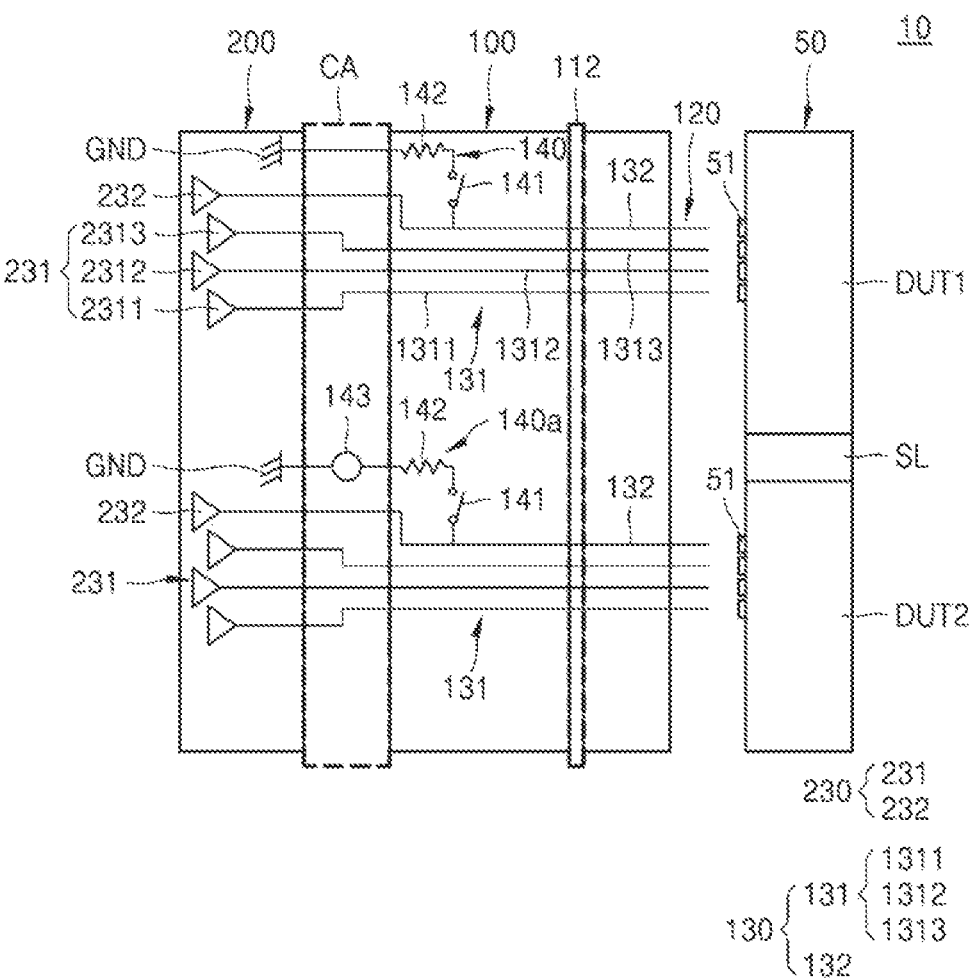
FIG. 3 is a diagram illustrating a test device according to some embodiments.

FIG. 2 is a cross-sectional view illustrating a probe card according to some embodiments. FIG. 3 is a diagram illustrating a test device according to some embodiments.

Referring to FIGS. 1-3, the probe card 100 may include the substrate 110, the probe pins 120, and a mechanical press 180. The substrate 110 may include a support substrate 111, an interposer 112, and a circuit board 113.

The circuit board 113 may include a plurality of channels 130 and at least one detection circuit 140 (which may be referred to hereinafter as "a detection circuit). For example, the circuit board 113 may include various relays (e.g., relay 141) for executing a parallel test.

The plurality of channels 130 may be electrically connected to the tester 200, may receive electrical signals from the tester 200, and may transmit the electrical signals to the tester 200. The plurality of channels 130 may respectively receive and transmit a plurality of different electrical signals. In addition, the plurality of channels 130 may include paths through which the received electrical signals move to a DUT.

The detection circuit 140 may be connected to one of the plurality of channels 130. The detection circuit 140 may be configured to determine whether the connected channel is defective. For example, when a plurality of detection circuits 140 are included, the plurality of detection circuits 140 may be connected to a plurality of different channels 130 and may be configured to determine whether the connected channels are defective.

Hereinafter, the defect of a channel may refer to an open state in which the channel is disconnected or a short-circuit state in which the channel is unintentionally connected to another channel. In addition, the defect of the channel may refer an open state in which the plurality of channels 130 of the probe card 100 are not electrically connected to the test head 250 of the tester 200 or a short-circuit state in which the plurality of channels 130 are unintentionally connected to the test head 250.

The circuit board 113 may be electrically connected to the tester 200. When the probe card 100 is mounted on the tester 200, the tester 200 may be connected to a connector portion CA of the circuit board 113 corresponding to a space in which the tester 200 physically contacts the circuit board 113. The connector portion CA may be a space in which electrical signals provided by the tester 200 are transferred to the plurality of channels 130 of the circuit board 113. In some embodiments, the connector portion CA may include at least one of a zero insertion force socket (ZIF), a low insertion force socket (LIF), a flexible flat cable (FFC), FPV, and a flexible printed circuit (FPC).

In some embodiments, the connector portion CA may include a plurality of pins 255. The plurality of pins 255 may physically contact and be electrically connected to a plurality of different channels 130, respectively.

Each of the plurality of pins 255 may include a plurality of pads, and the plurality of pads may respectively provide different electrical signals to the probe card 100. In other words, one pin may include a plurality of pads electrically connected to different channels and configured to transfer different electrical signals.

In some embodiments, the plurality of pins 255 may be arranged in at least two rows. In other words, the plurality of pins 255 may be arranged in a plurality of rows to transfer many types of electrical signals to the same area. For example, the plurality of pins 255 may be located on the side of the connector portion CA of the circuit board 113.

As shown in FIG. 2, each connector portion CA may include 3 protrusions with spaces therebetween and the plurality of pins 255 may be provided in a set of 2 pins and arranged in a row between openings in the connector portions CA. However, the number of connector portions and the number of pins are not limited thereto.

The number of the plurality of pads may be equal to the number of a plurality of electrical signals. That is, the plurality of electrical signals may be received by the probe card 100 through different pads. The number of electrical signals may be the same as the number of DUTs being tested. An electrical signal may be referred to as a parallelism or para.

The number of paras of the tester 200 may be increased to reduce the cost of the DUT. As the number of paras increases, the density of the plurality of pins 255 increases. As the density of the plurality of pins 255 increases, a phenomenon in which a contact defect occurs between a pin of the tester 200 and a channel of the probe card 100 increases. The test device 10 of the disclosure may quickly determine the contact defect through the detection circuit 140.

The support substrate 111 may face the stage 300 and may be disposed parallel to the circuit board 113. The support substrate 111 may be fixed by a connection column 181 extending from the mechanical unit 180. The probe pins 120 may be attached to one surface of the support substrate 111 facing the stage 300. The support substrate 111 may include, for example, a multi-layer ceramic (MLC) substrate or a single layer ceramic (SLC) substrate, but is not limited thereto.

The interposer 112 may be disposed between the circuit board 113 and the support substrate 111 to electrically connect the circuit board 113 to the support substrate 111.

The mechanical press 180 may be disposed on the circuit board 113. The mechanical press 180 may be provided to adjust the flatness of the probe card 100 and may evenly distribute a load applied to the probe card 100 during a test process.

The plurality of channels 130 and the detection circuit 140 are described in detail.

The wafer 50 may be a semiconductor wafer on which a first DUT DUT1 and a second DUT DUT2 are formed. The wafer 50 may include a scribe lane SL which is a reference line separating the first and second DUTs DUT1 and DUT2 in a subsequent singulation process. FIG. 3 shows two DUTs formed on the wafer 50, but the disclosure is not limited thereto.

The tester 200 may generate a plurality of electrical signals 230. In some embodiments, the tester 200 may include a plurality of nodes generating different electrical signals. The plurality of electrical signals 230 may test electrical characteristics of the first and second DUTs DUT1 and DUT2.

In some embodiments, the plurality of electrical signals 230 may include a power signal 232 and a test signal 231.

The power signal 232 may provide power to the wafer 50. That is, the power signal 232 may provide power to the wafer 50 such that the first and second DUTs DUT1 and DUT2 may operate. The power signal 232 may provide a constant potential. In some embodiments, the power signal 232 may apply a predetermined potential to a pad 51 of the wafer 50 and measure direct current (DC) characteristics such as an open state/short-circuit state, input current, output potential, power supply current, etc., to determine whether the first and second DUTs DUT1 and DUT2 are defective.

The test signal 231 may be implemented to inspect an electrical function of a DUT. In some embodiments, the test signal 231 may apply a pulse signal to the pad 51 of the wafer 50 and measure operating characteristics such as input/output transport delay time, start/end time of an output signal, etc., to determine whether the first and second DUTs DUT1 and DUT2 are defective. In some embodiments, the test signal 231 may include first to third test signals 2311, 2312, and 2313. Each of the first to third test signals 2311, 2312, and 2313 may include at least one of an input/output (I/O) test signal, an alternating current (AC) test signal, a VCC test signal, or a drive test signal. FIG. 3 shows that the plurality of electrical signals 230 includes the first to third test signals 2311, 2312, and 2313, but the disclosure is not limited thereto.

The plurality of channels 130 may respectively receive the plurality of electrical signals 230 of the tester 200. The plurality of channels 130 may respectively receive the plurality of different electrical signals 230 and transfer the received electrical signals 230 to the wafer 50. That is, one end of the plurality of channels 130 may be electrically connected to the tester 200 and the other end may be electrically connected to the pad 51 of the wafer 50.

In some embodiments, the plurality of channels 130 may include a power channel 132 and test channels 131 (which may be referred to as single channels for ease of description).

The power channel 132 may be a path through which the power signal 232 is received and moves to each of the first and second DUTs DUT1 and DUT2. That is, the power channel 132 may provide power to the wafer 50.

The test channel 131 may be a path through which the test signal 231 is received and moves to each of the first and second DUTs DUT1 and DUT2. That is, the test channel 131 may transmit and receive signals for inspecting a dynamic function of the wafer 50. The test channel 131 may include first to third test channels 1311, 1312 and 1313. In some embodiments, the first to third test channels 1311, 1312, and 1313 may be paths through which the first to third test signals 2311, 2312, and 2313 move respectively.

The detection circuit 140 may be connected to one of the plurality of channels 130. The detection circuit 140 may determine whether the connected channel 130 is defective. That is, the detection circuit 140 may determine whether the connected channel 130 is in an open state or in a short-circuit state. In some embodiments, the detection circuit 140 may be connected to the power channel 132 to determine whether the power channel 132 is defective.

One end of the detection circuit 140 may be connected to one of the plurality of channels 130, and the other end may be connected to a ground node GND. The ground node GND may provide a reference potential. That is, the detection circuit 140 may be a path for transferring an electrical signal flowing through a connected channel among the plurality of channels 130 to the ground node GND. In some embodiments, the detection circuit 140 may be connected to the power channel 132 among the plurality of channels 130.

In some embodiments, the detection circuit 140 may include a relay 141 and a resistor 142. The relay 141 may be a switch. In other words, the relay 141 may turn on/off the detection circuit 140. For example, the relay 141 may control an electrical connection between a channel to which the detection circuit 140 is connected and the ground node GND. A position of the resistor 142 may be located closer to the channel (e.g., channel 132) than the relay 141 or farther from the channel (e.g., channel 132) than the relay 141, regardless of the position of the relay 141. The detection circuit 140 may include multiple relays 141 and multiple resistors 142.

In some embodiments, a detection circuit 140a may include an ammeter 143 measuring an amount of current flowing through the detection circuit 140a. When the detection circuit 140a is on, current that flows through a channel to which the detection circuit 140a is connected may flow to the ground node GND. The ammeter 143 may measure the amount of current flowing through the detection circuit 140a.

In some embodiments, the tester 200 may determine whether the probe card 100 is defective and whether a contact between the probe card 100 and the tester 200 is defective based on the amount of current flowing through the detection circuit 140. That is, the tester 200 may determine whether the channel to which the detection circuit 140 is connected is defective and the connector portion CA in which the channel is connected to the tester 200 is defective through the detection circuit 140.

Figure 4:
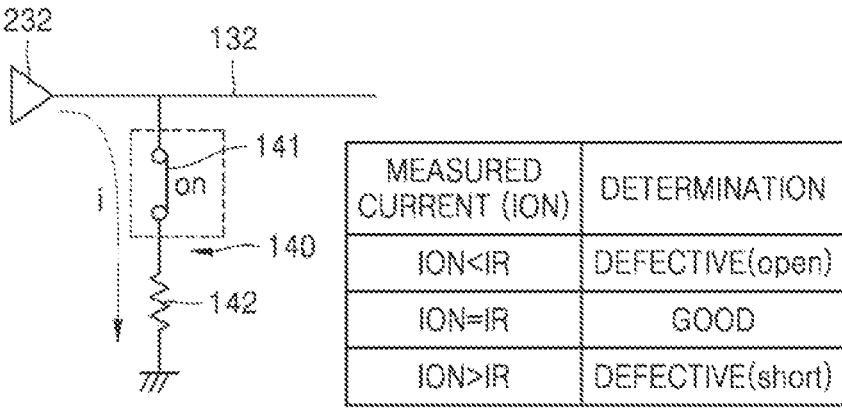
FIG. 4 is a diagram of a table and a detection circuit that illustrates a method of determining whether an input channel is abnormal, according to some embodiments.

FIG. 4 is a diagram of a table and a detection circuit that illustrates a method of determining whether an input channel is abnormal, according to some embodiments.

Hereinafter, when the detection circuit 140 is connected to the power channel 132, a method, performed by the tester 200, of determining whether the power channel 132 and the connector portion CA are detective through the detection circuit 140 is described with reference to FIG. 4. However, the detection circuit 140 may be connected to the test channel 131 as well as the power channel 132.

In an on-state where the relay 141 of the detection circuit 140 is closed, a signal flowing through the power channel 132 may be transferred to the ground node GND. Current may flow through the detection circuit 140. When the voltage of the power signal 232 and the resistance of the resistor 142 of the detection circuit 140 are calculated according to the Ohm's law, a value of current flowing through the detection circuit 140 may be calculated, and the calculated current value may be referred to as a reference current IR. According to the Ohm's law, $V=I \cdot R$, where V denotes voltage, I denotes current, and R denotes resistance.

In the on-state of the detection circuit 140, the tester 200 may measure the value of current flowing through the detection circuit 140, compare a measured current ION with the reference current IR, and determine whether the power channel 132 is defective. In some embodiments, when the measured current ION is substantially equal to the reference current IR, the tester 200 may determine that the power channel 132 and the connector portion CA are not defective. When the measured current ION is different from the reference current IR, the tester 200 may determine that at least one of the power channel 132 and the connector portion CA is defective.

Specifically, when the power channel 132 or the connector portion CA is in an open state, because the current does not flow through the detection circuit 140, the current ION measured by the detection circuit 140 may be less than the reference current IR. When the power channel 132 or the connector portion CA is in a short-circuit state, because an excessive current flows through the detection circuit 140, the current ION measured by the detection circuit 140 may be greater than the reference current IR. In summary, when the measured current ION is less than the reference current IR, the tester 200 may determine that at least one of the power channel 132 or the connector portion CA is in the open state, when the measured current ION is equal to the reference current IR, may determine that the power channel 132 and the connector portion CA are in a normal state, and when the measured current ION is greater than the reference current IR, may determine that at least one of the power channel 132 or the connector portion CA is in a short-circuit state.

In some embodiments, in a state where the relay 141 of the detection circuit 140 is in an off-state, the tester 200 may measure a current flowing through the detection circuit 140 and determine whether the power channel 132 and the connector portion CA are defective. Specifically, when the detection circuit 140 is in the off-state, because current does not flow through the detection circuit 140, the current measured when the detection circuit 140 is in the off-state may be substantially 0 ampere (A). When the current measured in the off-state of the detection circuit 140 is greater than 0 A, the tester 200 may determine that at least one of the power channel 132 or the connector portion CA is in the short-circuit state.

Figure 5:
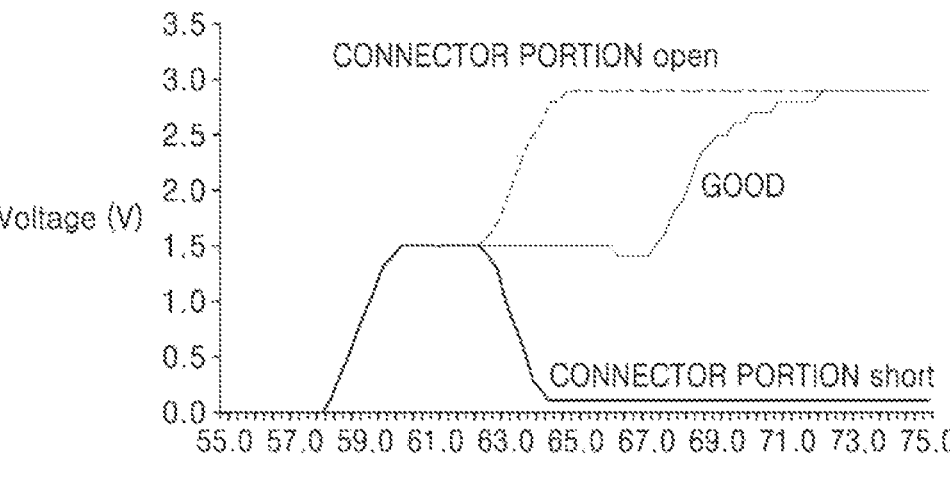
FIG. 5 is a graph illustrating a method of determining whether a test channel is abnormal, according to some embodiments.

FIG. 5 is a graph illustrating a method of determining whether a test channel is abnormal according to some embodiments. Hereinafter, when the detection circuit 140 is not connected to the test channel 131, a method of determining whether the test channel 131 and the connector portion CA are defective is described with reference to FIG. 5.

In some embodiments, in the case of the test channel 131, a line length of the test channel 131 may be measured by measuring a time of propagation delay (TPD), such as time domain reflectometry (TDR) which may correspond to an equipment measuring reflected light. The tester 200 may determine whether the test channel 131 and the connector portion CA are defective through the measured line length of the test channel 131. Specifically, when the TPD reaches a target voltage faster than a normal state, the tester 200 may determine that at least one of the test channel 131 or the connector portion CA is in an open-state, and, when there is a leakage current in the TPD, may determine that at least one of the test channel 131 or the connector portion CA is in a short-circuit state. In some embodiments, in the case of the test channel 131, the tester 200 may determine whether the test channel 131 is in an open state or a short-circuit state through the TPD even when the detection circuit 140 is not connected to the test channel 131.

Figure 6:
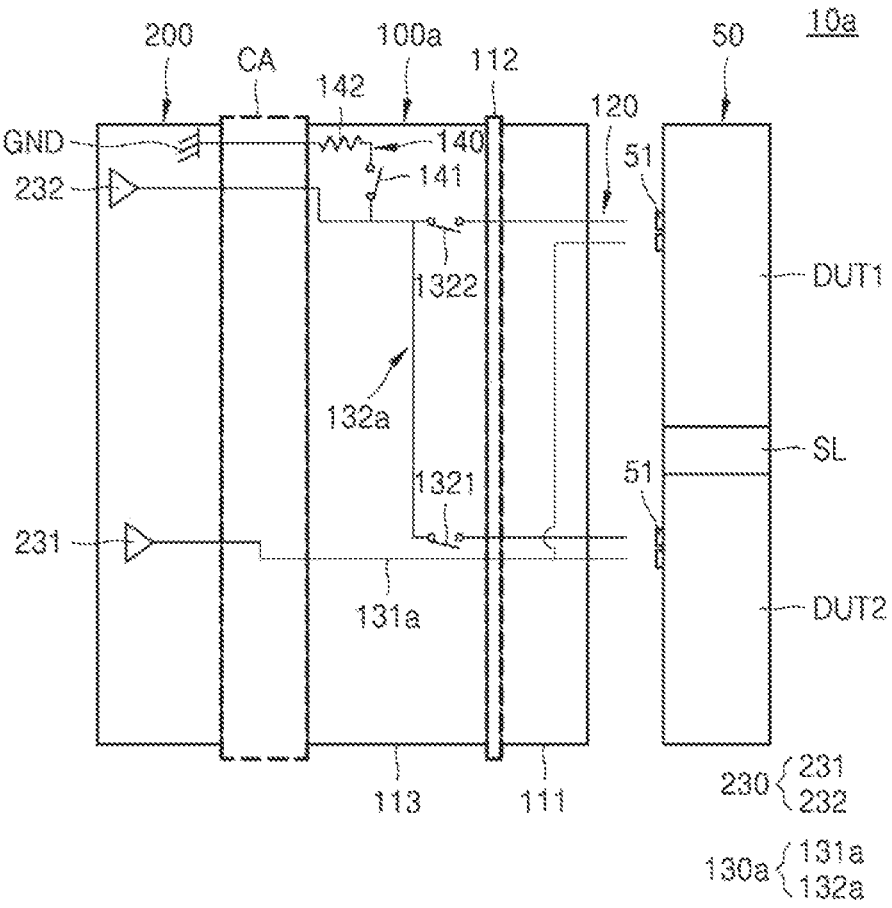
FIG. 6 is a diagram illustrating a test device according to some embodiments.

FIG. 6 is a diagram schematically illustrating a test device according to some embodiments.

Referring to FIG. 6, a test device 10a may include the tester 200 and a probe card 100a. The probe card 100a may include a plurality of channels 130a and the at least one detection circuit 140.

Hereinafter, repeated descriptions of the probe card 100a of FIG. 6 and the probe card 100 of FIG. 3 may be omitted, and differences therebetween are described.

Each of the plurality of channels 130a may be branched to be connected to different DUTs. That is, one channel may be branched into multiple branches, and the multiple branches may be connected to a plurality of DUTs. In other words, one electrical signal may be connected to branched channels and move to a plurality of DUTs.

In some embodiments, a power channel 132a transferring the power signal 232 may be branched and connected to the first and second DUTs DUT1 and DUT2. That is, the power channel 132a may be branched inside the probe card 100a and transfer the same power signal 232 to the first and second DUTs DUT1 and DUT2. In some embodiments, the power channel 132a may be branched into a first branch circuit 1321 and a second branch circuit 1322. The first branch circuit 1321 may be connected to the first DUT DUT1, and the second branch circuit 1322 may be connected to the second DUT DUT2.

In some embodiments, a relay 141 may be connected to each of the first branch circuit 1321 and the second branch circuit 1322 of power channel 132a. That is, a part of the power channel 132a may be branched and connected to the different probe pins 120, and a relay 141 may be connected to each of branched circuits. Through the relay 141 connected to each of the branched circuits, the state of the first and second branch circuits 1321 and 1322 (e.g., the on/off) may be controlled for each branched circuit. In addition, interference between the branched circuits may be suppressed. In some embodiments, a relay 141 may be connected to each of the first and second branch circuits 1321 and 1322 such that the first and second branch circuits 1321 and 1322 may be turned on/off independently.

In some embodiments, a test channel 131a connected to the test signal 231 may be branched and connected to the first and second DUTs DUT1 and DUT2. That is, the same test signal 231 may be transferred to the first and second DUTs DUT1 and DUT2 through the test channel 131a.

In some embodiments, the power channel 132a may be branched inside the circuit board 113 of the probe card 100a, and the test channel 131a may be branched inside the support substrate 111 of the probe card 100a. The test signal 231 may be branched from the support substrate 111 adjacent to the probe pin 120 to obtain an accurate test value. In addition, in the power channel 132a, a relay 141 may be connected to the branched circuit, and, in the test channel 131a, a relay 141 may not be connected to the branched circuit.

In some embodiments, the detection circuit 140 may be connected to one of the plurality of channels 130a. As shown in FIG. 6, the detection circuit 140 may be connected to the power channel 132a. However, the detection circuit 140 is not limited thereto, and may be connected to the test channel 131a. Hereinafter, an embodiment in which the detection circuit 140 is connected to the power channel 132a is described, which may be equally applied to an embodiment in which the detection circuit 140 is connected to the test channel 131a. In some embodiments, the detection circuit 140 may be the detection circuit 140 of FIG. 3 described above.

In some embodiments, the detection circuit 140 may connected to the power channel 132a before the power channel 132a is branched. That is, the detection circuit 140 may be connected to the power channel 132a in a region in which the power channel 132a is one circuit (i.e., in a region prior to the branching). In some embodiments, the power channel 132a may be branched from the circuit board 113 of the probe card 100a, and the detection circuit 140 may be connected to the power channel 132a in the circuit board 113. The detection circuit 140 may determine whether the power channel 132a and the connector portion CA are defective before the power signal 232 is branched to the first and second branch circuits 1321 and 1322.

Figure 7:
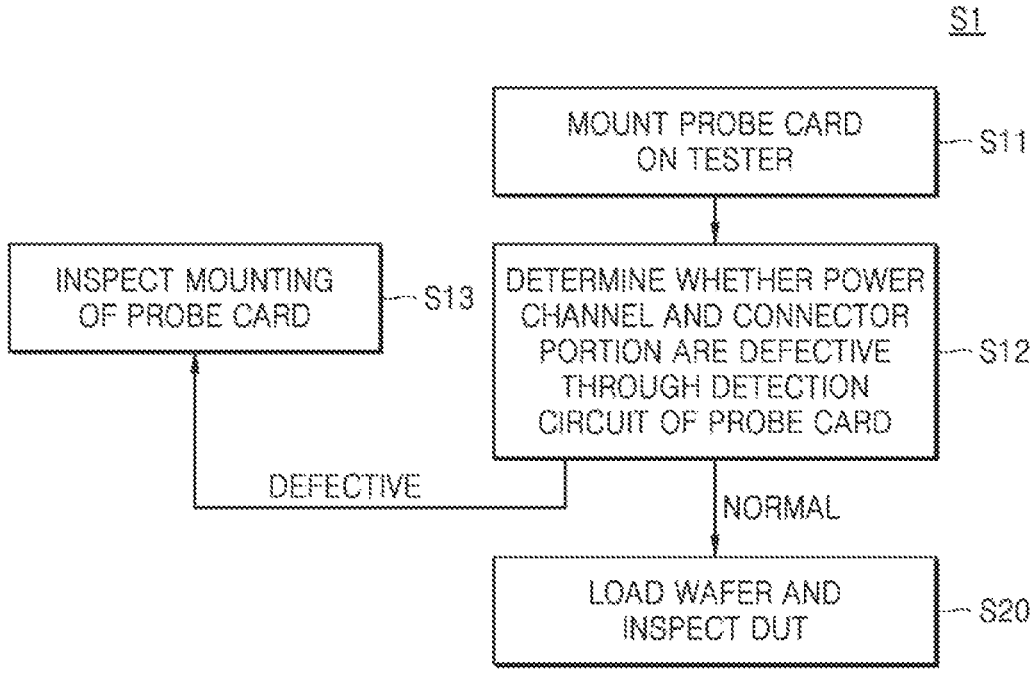
FIG. 7 is a flowchart illustrating a test method according to some embodiments.

FIG. 7 is a flowchart Si illustrating a test method according to some embodiments.

Referring to FIG. 7, the test method according to an embodiment may include operation S11 of mounting a probe card on a tester, and operation S12 of determining whether a power channel and a connector portion are defective through a detection circuit of the probe card. As a result of determination, when states of the power channel and the connector portion are normal, operation S20 of loading a wafer and inspecting a DUT may be performed. When states of the power channel and the connector portion are defective, operation S13 of inspecting mounting of the probe card may be performed.

In some embodiments, in operation S11, a probe card may be mounted on the tester. A circuit board of the probe card may be connected to a tester head of the tester. The tester may include the connector portion that is a region contacting the probe card. The connector portion may include a plurality of pins, and the plurality of pins may physically contact a plurality of channels of the circuit board. The plurality of pins of the connector portion may transmit a plurality of electrical signals of the tester to a plurality of channels of the circuit board.

In operation S12, it may be determined whether the power channel and the connector portion are defective through the detection circuit connected to the power channel. That is, before inspecting the DUT of the wafer, it may be determined in advance whether the power channel and the connector portion are defective through the detection circuit. The detection circuit may be connected to the power channel and include a relay and a resistor. A method of determining whether the power channel and the connector portion are defective through the detection circuit is described below with reference to FIGS. 9 and 10.

When the power channel and the connector portion are not defective, in operation S20, the wafer may be loaded on a stage, and the DUT of the wafer may be inspected. The tester may provide a plurality of signals to the DUT through the probe card. The plurality of electrical signals may include a power signal and a tester signal. An electric die sorting (EDS) process may be performed on the DUT. The EDS process may refer to a process of applying an electrical signal to a DUT and determining whether semiconductor devices are defective based on a signal output from the DUT in response to the applied electrical signal.

In some embodiments, it may be determined whether the power channel and the connector portion are defective by comparing an inspection value detected in a process of inspecting the DUT with a standard value. That is, it may be determined whether the power channel and the connector portion are defective by comparing a data value measured when inspecting the DUT with data values measured by a normal power channel and connector portion.

When the power channel and connector portion are defective, in operation S13, a connection state between the probe card and the tester may be inspected. Specifically, a state of the probe card and the connector portion to which the tester is connected may be inspected. It may be inspected whether a plurality of pins located in the connector portion are normally connected to a plurality of channels of the probe card. After inspecting the probe card and the connector portion, the probe card may be mounted on the tester again.

Figure 8:
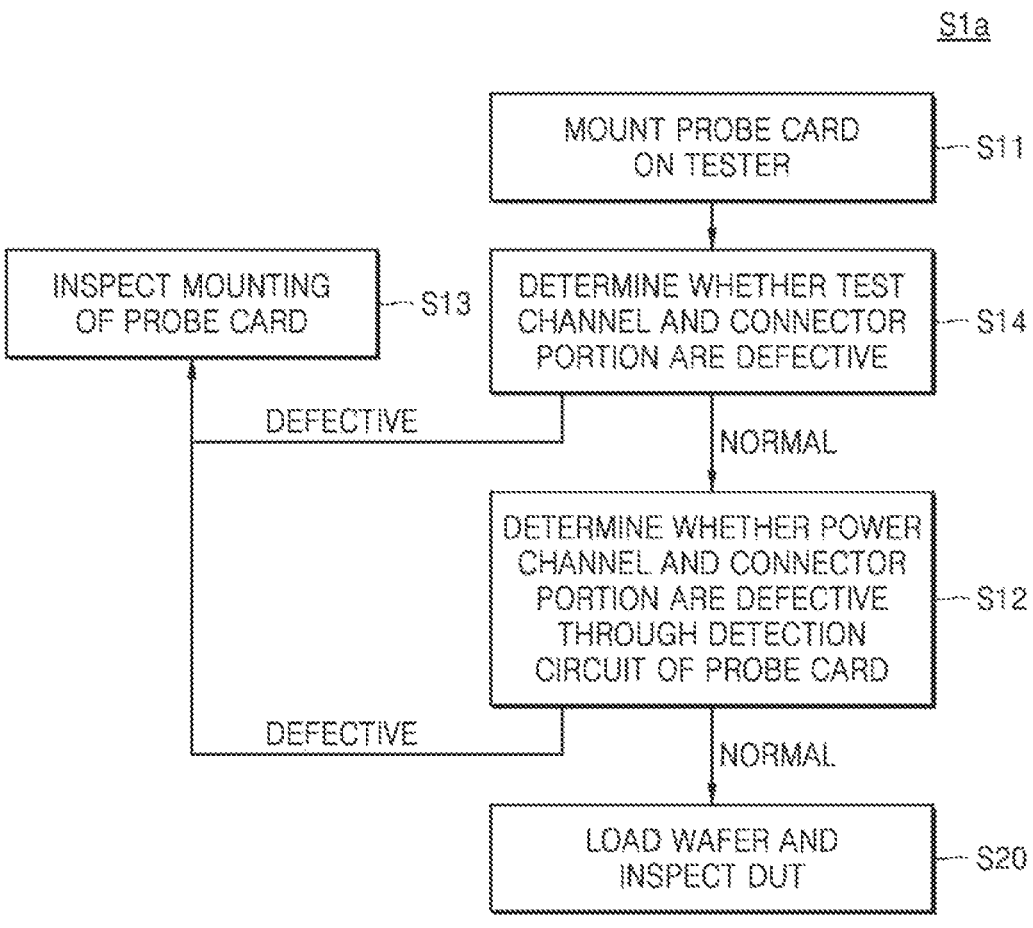
FIG. 8 is a flowchart illustrating a test method according to some embodiments.

FIG. 8 is a flowchart S1a illustrating a test method according to some embodiments.

Referring to FIG. 8, the test method according to an embodiment may include operation S11 of mounting a probe card on a tester, operation S14 of determining whether a test channel and a connector portion are defective, and operation S12 of determining whether a power channel and the connector portion are defective through a detection circuit of the probe card. When states of the power channel and the connector portion are normal, operation S20 of loading a wafer and inspecting a DUT may be performed. (i.e., when the determination of operation S14 is normal, the method may proceed to operation S12, and when the determination of operation S12 is normal, the method may proceed to operation S20). When states of the power channel and the connector portion are defective in either operation S14 or operation S12, operation S13 of inspecting mounting of the probe card may be performed.

Hereinafter, repeated descriptions of the test method of FIG. 8 and the test method of FIG. 7 may be omitted, and differences therebetween are described.

After mounting the probe card on the tester, it may be determined whether the test channel and the connector portion are defective in operation S14. In some embodiments, the detection circuit may not be connected to the test channel.

In FIG. 8, operation S14 of determining whether the test channel and the connector portion are defective precedes operation S12 of determining whether the power channel and the connector portion are defective, but operation S14 of determining whether the test channel and the connector portion are defective may follow operation S12 of determining whether the power channel and the connector portion are defective In some embodiments, it may be determined whether the test channel and the connector portion are defective by measuring a TPD. For example, when the TPD is shorter than a normal state, it may be determined that at least one of the test channel or the connector portion is in an open state, and when a leakage current is measured in the TPD, it may be determined that at least one of the test channel or the connector portion is in a short-circuit state.

When it is determined that the test channel and the connector portion are defective, in operation S13, a mounting state of the probe card may be inspected. Specifically, a state of the probe card and the connector portion to which the tester is connected may be inspected. It may be determined whether a plurality of pins located in the connector portion are normally connected to a plurality of channels of the probe card. After inspecting the probe card and the connector portion, the probe card may be mounted on the tester again (i.e., operation S11 may be repeated).

Figure 9:
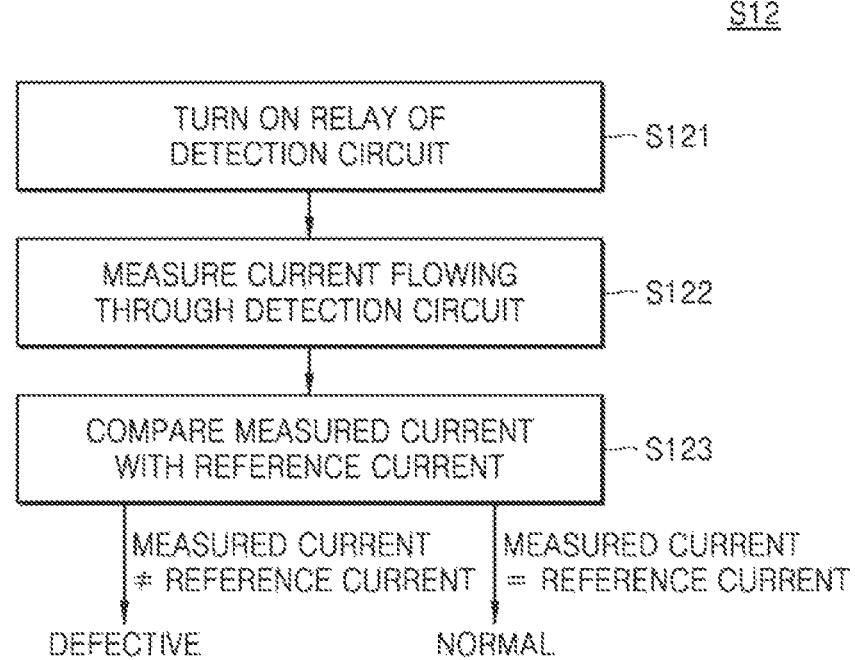
FIG. 9 is a flowchart illustrating a method of determining whether a power channel is defective among test methods according to some embodiments.

FIG. 9 is a flowchart illustrating a method of determining whether a power channel is defective among test methods according to some embodiments. FIG. 9 may correspond to operation S12 of FIGS. 7 and 8.

Referring to FIG. 9, a method of determining whether the power channel and a connector portion are defective through a detection circuit may include operation S121 of turning on a relay of the detection circuit, operation S122 of measuring a current flowing through the detection circuit, and operation S123 of comparing the measured current with a reference current.

The relay of the detection circuit may be turned on in operation S121. The relay may be a switch. The relay may be turned on/off by an operation of an operator. The detection circuit may be electrically connected to the power channel while the relay is on, and the detection circuit may be electrically disconnected to the power channel when the relay is off.

In operation S122, it may be determined whether a channel to which the detection circuit is connected is defective by measuring the amount of current flowing through the detection circuit. In some embodiments, the detection circuit may be connected to the power channel, and it may be determined whether the power channel is defective. A current flowing through the detection circuit in a state where a channel to which the detection circuit is connected is normal may be referred to as a reference current.

In operation S123, when the amount of the measured current is substantially equal to the amount of the reference current, the channel to which the detection circuit is connected may be determined to be in a normal state. In operation S123, when the amount of the measured current is different from the amount of the reference current, the channel to which the detection circuit is connected may be determined to be in a defective state.

Specifically, when the amount of the measured current is less than the amount of the reference current, it may be determined that there is an opening between the power channel and the tester, and when the amount of the measured current is greater than the amount of the reference current, it may be determined that there is a short-circuit between the power channel and the tester.

In the test method of the disclosure, the time required to inspect a mounting state of a probe card may be reduced, by comparing the amount of the measured current and the amount of the reference current and determining a connection state between the power channel and the tester.

Figure 10:
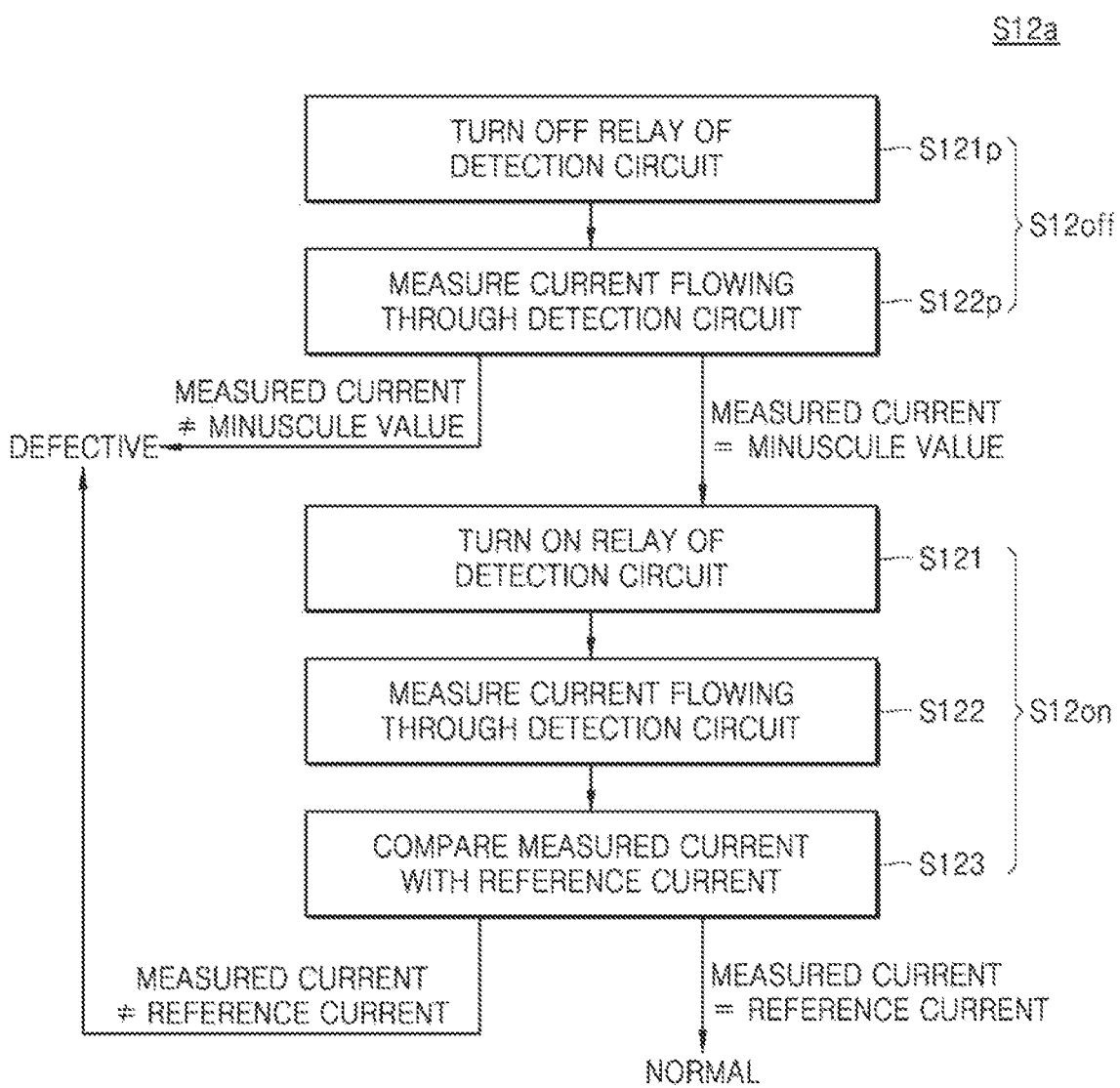
FIG. 10 is a flowchart of a method of determining whether a power channel is defective among test methods according to some embodiments.

FIG. 10 is a flowchart of a method of determining whether a power channel is defective among test methods according to some embodiments.

Hereinafter, repeated descriptions of the method of determining whether the power channel is defective in FIG. 10 and the method of determining whether the power channel is defective in FIG. 9 may be omitted, and differences therebetween are described.

The method of determining whether the power channel is defective may include operation S12off of turning off a relay of a detection circuit and determining whether the power channel is defective, and operation S12on of turning on the relay of the detection circuit and determining whether the power channel is defective.

Operation S12off of turning off the relay of the detection circuit and determining whether the power channel is defective may further include operation S121p of turning off the relay and operation S122p of measuring a current flowing through the detection circuit while the relay is off.

The relay of the detection circuit may be turned off in operation S121p. When the relay of the detection circuit is turned off, no current substantially flows through the detection circuit. In operation S122p, it may be determined whether the power channel is defective by measuring the current flowing through the detection circuit.

Specifically, when the measured current is a minuscule value, because no current substantially flows through the detection circuit, the power channel may be determined to be in a normal state, and, when the measured current is not a minuscule value, that is, when the measured current is excessive, it may be determined that the power channel is in a defective state.

Next, operation S12on of turning on the relay of the detection circuit and determining whether the power channel is defective may include operation S121 of turning on the relay of the detection circuit, operation S122 of measuring the current flowing in the detection circuit, and operation S123 of comparing the measured current with a reference current. Operation S12on of turning on the relay of the detection circuit and determining whether the power channel is defective may correspond to operation S12 of determining whether the power channel is defective of FIG. 9.

In some embodiments, in a process of turning off the relay of the detection circuit and determining whether the power channel is defective, when the power channel is determined to be in a normal state, the relay of the detection circuit may be turned on, and it may be determined whether the power channel is defective. Accuracy of determining whether the power channel is defective may be increased by determining whether the power channel is defective at least twice.

Figure 11:
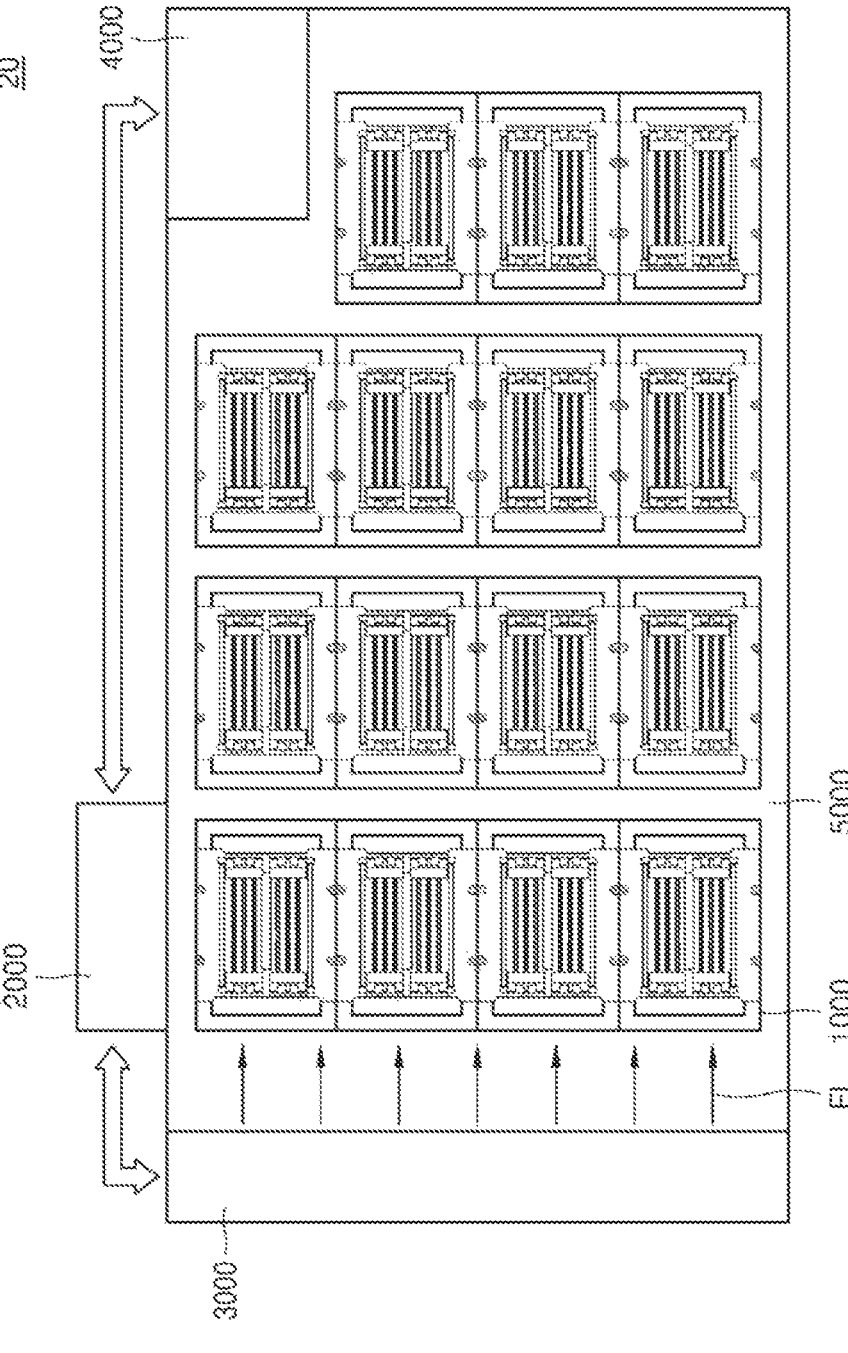
FIG. 11 is a diagram illustrating a semiconductor device manufacturing system including a semiconductor module test device according to some embodiments.

FIG. 11 is a diagram illustrating a semiconductor device manufacturing system including a semiconductor module test device according to some embodiments.

Referring to FIG. 11, a semiconductor device manufacturing system 20 may include a semiconductor module test device 1000, a temperature controller 2000, a fluid supply route 3000, a control interface 4000, and a test device mounting unit 5000.

Figure 14:
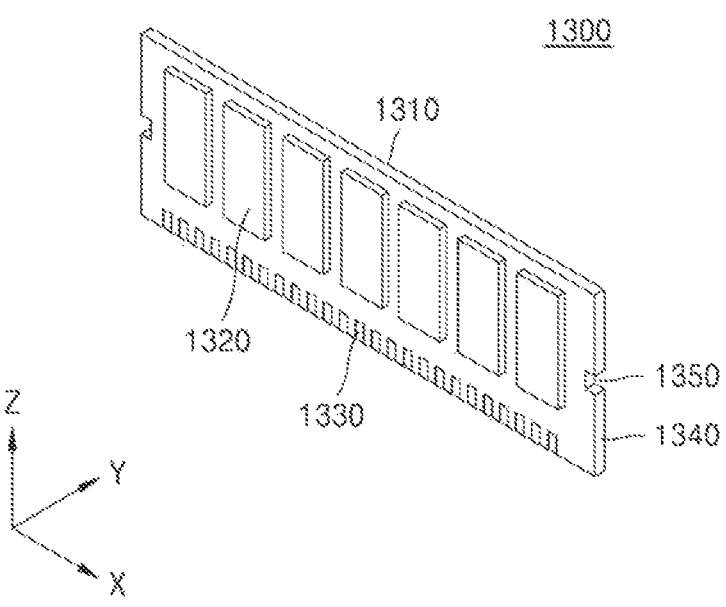
FIG. 14 is a perspective view of a semiconductor module that is a device under test (DUT) that may be inserted into a socket, according to some embodiments.

The semiconductor device manufacturing system 20 may be a system for testing a semiconductor module 1300 (see FIG. 14) including semiconductor packages 1320 (see FIG. 14). Tests performed by the semiconductor device manufacturing system 20 may include a DC test, a burn-in test, a monitoring burn-in test, a post burn-in test, and a final test. On a test board provided in the semiconductor module test device 1000, a plurality of temperature sensors for measuring the temperature inside the semiconductor packages 1320 (see FIG. 14) and/or the semiconductor module test device 1000 in real time may be provided. Alternatively, the semiconductor module 1300 (see FIG. 14) tested by the semiconductor module test device 1000 may include a semiconductor package including its own temperature sensor. For example, a semiconductor stack may include a resistance temperature device (RTD).

The temperature controller 2000 may perform a certain temperature control program to control the fluid supply route 3000 to heat and cool the internal temperature of the semiconductor module test device 1000 and the temperature of the semiconductor module 1300 (see FIG. 14) to a previously programmed target temperature.

The temperature controller 2000 may be connected to a plurality of temperature sensors, compare the temperature measured by each of the plurality of temperature sensors with a target temperature, and determine whether to cool or heat the inside of the semiconductor module test device 1000 and the semiconductor packages 1320 (see FIG. 14). Subsequently, the fluid supply route 3000 may be driven to supply a cooling or heating fluid FL to the semiconductor module test device 1000.

The control interface 4000 may include a personal computer or a central computer. The control interface 4000 may provide a test command for testing the operating performance of a device according to the temperature to DUTs. The control interface 4000 may input testing parameters to the temperature controller 2000 to update and correct the testing parameters. Alternatively, the control interface 4000 may provide individual commands to the temperature controller 2000 according to test conditions based on the temperature measured by each of the temperature sensors.

The test device mounting unit 5000 may be configured to support and connect each component of the semiconductor device manufacturing system 20. The semiconductor module test device 1000 may be mounted on the test device mounting unit 5000. The semiconductor test device mounting unit 5000 may cover a side surface and a lower portion of the semiconductor device manufacturing system 20 such that the mounted semiconductor module test device 1000 is not exposed to an external foreign substance or impact. The module test device mounting unit 5000 may include a plurality of CPU boards configured to control the individual semiconductor module test devices 1000.

Figure 12:
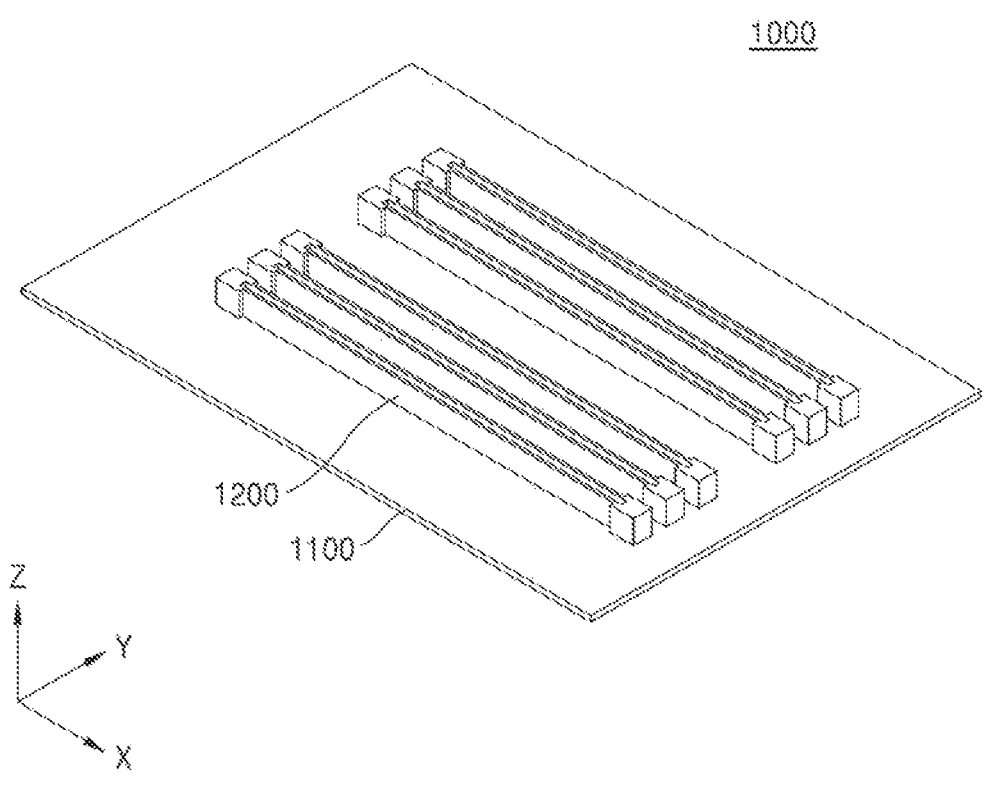
FIG. 12 is a perspective view illustrating a semiconductor module test device according to some embodiments.
Figure 13:
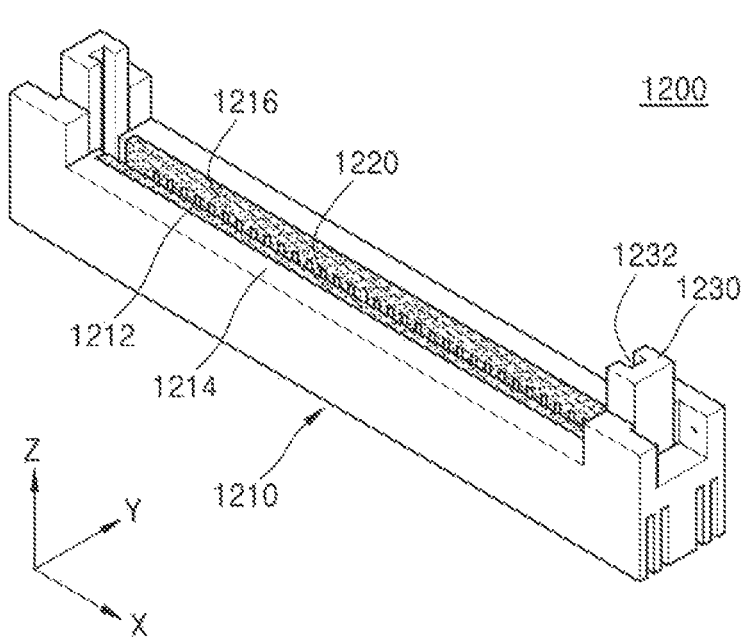
FIG. 13 is a perspective view illustrating a plurality of sockets included in a semiconductor module test device according to some embodiments.

FIG. 12 is a perspective view illustrating a semiconductor module test device according to some embodiments. FIG. 13 is a perspective view illustrating a plurality of sockets included in the semiconductor module test device of FIG. 12, according to some embodiments. That is, FIG. 13 is a perspective view illustrating a socket 1200 according to some embodiments.

Referring to FIGS. 12 and 13, the semiconductor module test device 1000 may include a test board 1100 and a plurality of sockets 1200. The semiconductor module test device 1000 may further include a top plate disposed on the test board 1100 to protect the test board 1100 from external impact and foreign substances.

Hereinafter, two directions parallel to and orthogonal to an upper surface of a substrate on an upper surface of the test board 1100 are defined as the X direction and the Y direction, respectively, and a substantially perpendicular direction is defined as the Z direction. In addition, even when each component before being coupled with the test board 1100 is described, directions may be referred to in the same manner as described above in consideration of each component after being coupled with the test board 1100.

The plurality of sockets 1200 may be spaced apart from each other by a predetermined distance in the Y direction of the test board 1100. A basic circuit and components of the semiconductor module test device 1000 are mounted on the test board 1100. The test board 1100 may stably drive the semiconductor module test device 1000 while supporting the entire semiconductor module test device 1000.

The semiconductor module 1300 (see FIG. 14), which may be a DUT, may be inserted into the plurality of sockets 1200. A plurality of socket pins 1220 corresponding to external connection terminals 1330 (see FIG. 14) of the inserted semiconductor module 1300 (see FIG. 14) may be formed inside the plurality of sockets 1200.

Referring to FIG. 13, the socket 1200 may include a socket frame 1210, the plurality of socket pins 1220 and module engaging portions 1230.

The socket frame 1210 may have a long bar shape in the X direction, which is a longitudinal direction, and may include two inner bodies 1212 and an outer body 1214. The two inner bodies 1212 may be formed on both sides of the socket frame 1210 so as to face each other in the Y direction perpendicular to the longitudinal direction of the socket frame 1210, and may include an insulating material.

A slot 1216 extending in the X direction may be formed in the center of both side surfaces of the inner bodies 1212. A lower end of a printed circuit board (PCB) 1310 (see FIG. 14) of the semiconductor module 1300 (see FIG. 14) may be inserted into the slot 1216. The plurality of socket pins 1220 configured to respectively contact a plurality of external connection terminals 1330 (see FIG. 14) may be disposed on both side surfaces of the slot 1216. The plurality of socket pins 1220 are arranged in the X direction, which is the longitudinal direction of the socket frame 1210. The plurality of socket pins 1220 may be engaged with and supported by the inner bodies 1212. When the socket 1200 is installed on the test board 1100 (see FIG. 12), the plurality of socket pins 1220 may be electrically connected to a circuit installed on the test board 1100 (see FIG. 12).

The outer body 1214 may cover the outside of the inner body 1212. The module engaging portions 1230 for fixing the semiconductor module 1300 (see FIG. 12) may be disposed at both ends of the outer body 1214 in the X direction.

The socket 1200 of the disclosure may include a detection circuit to determine whether a defect occurs in a process of transferring a power signal formed by a test board to a semiconductor module without a separate device.

FIG. 14 is a perspective view of a semiconductor module that is a DUT that may be inserted into a socket according to some embodiments.

Referring to FIG. 14, a semiconductor module 1300 may include the PCB 1310, semiconductor packages 1320, and external connection terminals 1330.

According to some embodiments, the semiconductor module 1300 may be a memory module. For example, the semiconductor module 1300 may include a dual inline memory module (DIMM), a small outline DIMM (SO-DIMM), an unbuffered-DIMM, or a fully buffered DIMM (FB-DIMM). However, the semiconductor module 1300 is not limited thereto, and may be a non-memory module.

The PCB 1310 may have a rectangular plate shape. Socket binding units 1340 engaged with the socket 1200 (see FIG. 13) may be formed at both ends of the PCB 1310 in the X direction. A hook insertion groove 1350 may be formed in a center portion of the socket binding unit 1340 to more stably engage with the socket 1200 (see FIG. 13).

The PCB 1310 may be a substrate on which the plurality of semiconductor packages 1320 are mounted. The PCB 1310 may be a PCB card, a plastic substrate, or a semiconductor substrate having another structure. The PCB 1310 may have a structure in which a plurality of metal wiring layers and a plurality of insulating layers are alternately stacked.

The semiconductor packages 1320 may be non-volatile memory devices. According to an example, the semiconductor packages 1320 may be NAND-type flash memories. In another example, the semiconductor packages 1320 may be phase-change random access memory (RAM) (PRAM), magnetoresistive RAM (MRAM), resistive RAM (Re-RAM), ferroelectric RAM (FRAM), NOR flash memory, etc. Also, the semiconductor packages 1320 may be volatile memory devices such as dynamic RAM (DRAM) and static RAM (SRAM).

In some cases, the semiconductor module 1300 may further include a register. The register may be a high-speed and dedicated region that temporarily stores a very small amount of data or intermediate results that are being processed. The register may include an accumulator, an arithmetic register, an instruction register, a shift register, an index register, etc.

At the lower end of the PCB 1310, the plurality of external connection terminals 1330 may be arranged in a row in the longitudinal direction (i.e., X direction) of the PCB 1310. The external connection terminals 1330 may include ground terminals, power terminals, and signal terminals. The signal terminals may include an address terminal to which an address signal is input, a command terminal to which a command signal is input, a clock terminal to which a clock signal is input, a data terminal to which data is input or output, and a power terminal providing power. In some embodiments, the external connection terminal 1330 may be any one of a pad, a pin, or a tab.

Figure 15:
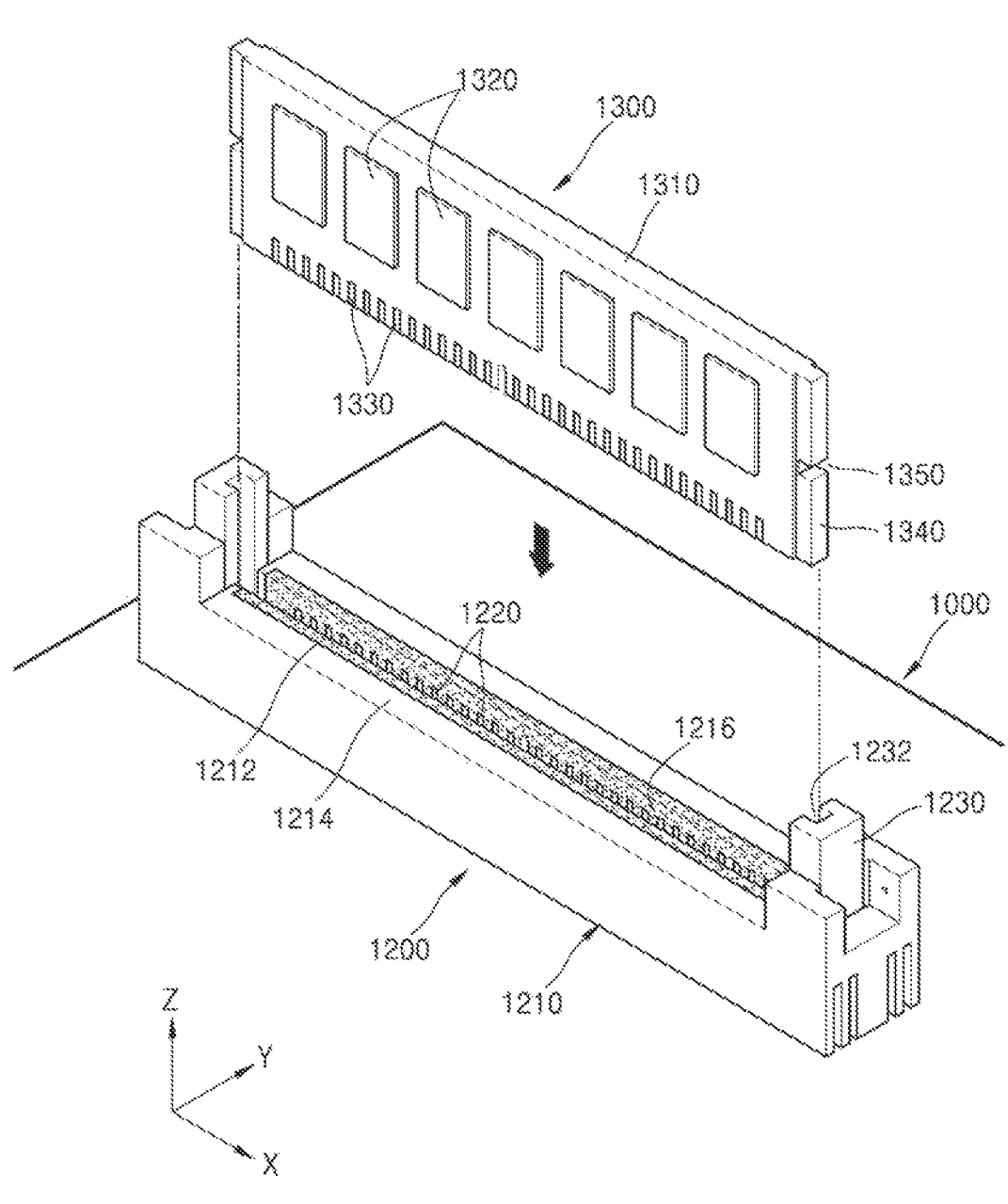
FIG. 15 is a perspective view illustrating insertion of a semiconductor module into a socket according to some embodiments.

FIG. 15 is a perspective view illustrating insertion of a semiconductor module into a socket according to some embodiments. In particular, FIG. 15 is a perspective view illustrating insertion of the semiconductor module 1300 of FIG. 14 into the socket 1200 of FIG. 13.

Referring to FIG. 15, the plurality of sockets 1200 may be supported and formed on the test board 1100, and the semiconductor module 1300 may be engaged with and supported by the plurality of sockets 1200. Specifically, the lower end of the PCB 1310 of the semiconductor module 1300 may be inserted into the slot 1216 formed in the socket frame 1210 of the plurality of sockets 1200. As a result, physical and/or electrical contact is made between the external connection terminals 1330 arranged on the lower end of the PCB 1310 and the plurality of socket pins 1220 arranged on both sides of the slot 1216.

When the semiconductor module 1300 is inserted into the plurality of sockets 1200, due to friction between the socket pins 1220 and the external connection terminals 1330, remains of the external connection terminals 1330 may be buried in the socket pins 1220, which may increase the contact resistance of the socket pins 1220.

The test board 1100 may include an I/O test node, a VCC test node, a resistance test input node, and a resistance test output node. The I/O test node, the VCC test node, the resistance test input node, and the resistance test output node may be substantially the same as those described with reference to FIG. 3, FIG. 6, etc.

The socket 1200 may perform substantially the same function as the probe card 100 (see FIG. 1) described above. That is, the socket 1200 may be used as an intermediate medium between the test board 1100 forming an electrical signal and the semiconductor module 1300 including each DUT.

In some embodiments, the socket 1200 may include a plurality of channels and at least one detection circuit. The plurality of channels may include a plurality of channels of the probe card described above. The detection circuit may include a detection circuit of the probe card described above.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A test device comprising:
   a tester configured to provide a plurality of electrical signals to a device under test (DUT); and
   a probe card removably attached to the tester, the probe card comprising a plurality of channels and at least one detection circuit,
   wherein each of the plurality of channels comprises a path through which a respective electrical signal of the plurality of electrical signals moves from the tester to the DUT,
   wherein the at least one detection circuit is connected to one of the plurality of channels, and
   wherein the at least one detection circuit is configured to determine whether the connected channel is defective.

2. The test device of claim 1, wherein, the probe card is on the tester,
   wherein the tester further comprises a connector portion that contacts the probe card, and
   wherein the connector portion comprises a plurality of pins respectively connected to the plurality of channels.

3. The test device of claim 2, wherein the plurality of pins of the connector portion are arranged in at least two rows.

4. The test device of claim 1, wherein the at least one detection circuit comprises a relay and a resistor.

5. The test device of claim 1, wherein the at least one detection circuit comprises:
   a first end connected to one of the plurality of channels; and a second end connected to a ground node that is configured to provide a reference potential.

6. The test device of claim 1, further comprising an ammeter configured to measure an amount of current in the at least one detection circuit.

7. The test device of claim 1, wherein the plurality of electrical signals comprise a power signal providing power to the DUT,
   wherein the plurality of channels comprise at least one power channel through which the power signal moves, and
   wherein the at least one detection circuit is connected to the at least one power channel.

8. The test device of claim 7, wherein the at least one power channel is branched into a plurality of power channels configured to be respectively connected to a plurality of DUTs.

9. The test device of claim 8, further comprising a first branch circuit corresponding to a first power channel of the plurality of power channels, and a second branch circuit corresponding to a second power channel of the plurality of power channels,
   wherein a relay of the at least one detection circuit is respectively connected to the first branch circuit and the second branch circuit.

10. The test device of claim 8, wherein the at least one detection circuit is connected to the at least one power channel at a position prior to the branching of the at least one power channel.

11. A test device comprising:
    a tester configured to provide a plurality of electrical signals to a device under test (DUT);
    a probe card comprising a substrate configured to be removably attached from the tester; and
    a connector portion in which the tester is configured to contact the probe card when the probe card is attached to the tester,
    wherein the probe card comprises a plurality of channels and at least one detection circuit,
    wherein the plurality of channels respectively receive the plurality of electrical signals,
    wherein each of the plurality of channels comprises a path through a respective electrical signal of the plurality of electrical signals moves from the tester to the DUT,
    wherein the at least one detection circuit is connected to one of the plurality of channels, and
    wherein the at least one detection circuit is configured to determine whether the connector portion is defective.

12. The test device of claim 11, wherein the substrate of the probe card comprises:
    a circuit board;
    a support substrate; and
    an interposer configured to connect the support substrate to the circuit board.

13. The test device of claim 11, wherein the plurality of channels comprise a power channel connected to the at least one detection circuit,
    wherein the plurality of electrical signals comprise a power signal that provides power to the DUT, and
    wherein the at least one detection circuit is configured to provide a path through which the power signal moves.

14. The test device of claim 13, wherein the plurality of channels comprise a test channel that is not connected to the at least one detection circuit,
    wherein the plurality of electrical signals comprise a test signal provided to inspect an electrical function of the DUT, and wherein the test channel provides a path through which the test signal moves.

15. A test method of a semiconductor device, the test method comprising:

providing a probe card on a tester, the probe card comprising at least one detection circuit;

determining whether a power channel through which a power signal moves is defective, the power signal being among a plurality of electrical signals provided by the tester, and wherein the at least one detection circuit is connected to the power channel;

based on determining that the power channel is defective inspecting, by the at least one detection circuit, a connection between the probe card and the tester; and based on determining that the power channel is not defective:

attaching a device under test (DUT) to the probe card, and inspecting, by the probe card and the tester, the DUT.

16. The test method of claim 15, wherein the plurality of electrical signals provided by the tester comprises a test signal, wherein the method further comprises determining whether a test channel through which the test signal moves is defective, and wherein the at least one detection circuit is not connected to the test channel.

17. The test method of claim 15, wherein the at least one detection circuit comprises a relay and a resistor, and wherein the determining whether the power channel is defective comprises determining whether reception of the power signal of the power channel is defective by measuring a current in the at least one detection circuit while the relay is on.

18. The test method of claim 17, wherein the method comprises:

determining that there is an opening between the power channel and the tester based on an amount of the measured current being less than an amount of a reference current, and determining that there is a short between the power channel and the tester based on the amount of the measured current being greater than the amount of the reference current.

19. The test method of claim 17, wherein the determining whether the connection between the probe card and the tester is defective comprises, while the relay is off:

determining whether the reception of the power signal of the power channel is defective by measuring a current in the at least one detection circuit; and based on determining that the reception of the power signal of the power channel is not defective, determining whether the reception of the power signal of the power channel is defective while the relay is on.

20. The test method of claim 15, further comprising determining whether reception of the power signal through the power channel is defective by comparing an inspection value with a standard value, the inspection value being obtained from inspecting the DUT.

\* \* \* \* \*